(12) United States Patent
Zheng et al.

(10) Patent No.: US 12,043,889 B2
(45) Date of Patent: Jul. 23, 2024

(54) MASK PLATE, METHOD FOR FABRICATING THE SAME, AND MASK PLATE ASSEMBLY

(71) Applicants: Chengdu BOE Optoelectronics Technology Co., Ltd., Sichuan (CN); BOE TECHNOLOGY GROUP CO., LTD., Beijing (CN)

(72) Inventors: Yong Zheng, Beijing (CN); Shuai Du, Beijing (CN); Wenbiao Ding, Beijing (CN); Junxiu Dai, Beijing (CN); Chunyan Gao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 335 days.

(21) Appl. No.: 17/425,463

(22) PCT Filed: Jan. 12, 2021

(86) PCT No.: PCT/CN2021/071255
§ 371 (c)(1),
(2) Date: Jul. 23, 2021

(87) PCT Pub. No.: WO2021/147705
PCT Pub. Date: Jul. 29, 2021

(65) Prior Publication Data
US 2022/0316042 A1    Oct. 6, 2022

(30) Foreign Application Priority Data
Jan. 22, 2020    (CN) .......................... 202010075660.1

(51) Int. Cl.
*C23C 14/04* (2006.01)
*B23K 26/382* (2014.01)
*H10K 71/00* (2023.01)

(52) U.S. Cl.
CPC .......... *C23C 14/042* (2013.01); *B23K 26/382* (2015.10); *H10K 71/00* (2023.02)

(58) Field of Classification Search
None
See application file for complete search history.

(56) References Cited

U.S. PATENT DOCUMENTS

2014/0150721 A1* 6/2014 Oh .......................... C23C 14/042
                                                                    118/504
2015/0376765 A1* 12/2015 Xiong .................. C23C 14/042
                                                                    118/721
(Continued)

FOREIGN PATENT DOCUMENTS

CN    104630705 A    5/2015
CN    107653435 A    2/2018
(Continued)

OTHER PUBLICATIONS

China Patent Office, First Office Action issued Apr. 1, 2021 for application No. CN202010075660.1.
(Continued)

*Primary Examiner* — Charles Capozzi
(74) *Attorney, Agent, or Firm* — HOUTTEMAN LAW LLC

(57) ABSTRACT

The present application provides mask plate, fabrication method thereof, and mask plate assembly. The mask plate includes two opening areas being respectively on different sides of mask pattern area along first direction, and two welding areas. One welding area is on a side of one opening area away from the mask pattern area along first direction, and the other welding area is on a side of the other opening (Continued)

area away from mask pattern area along first direction. Evaporation holes are arranged in mask unit, buffer holes are arranged in each opening area, and ratio of maximum dimension of buffer hole in any direction in plane where the mask plate is located to maximum dimension of evaporation hole in the direction is greater than 100. Buffer holes are distributed at equal intervals along a second direction, and second direction is in the plane and is perpendicular to first direction.

19 Claims, 4 Drawing Sheets

(56) References Cited

U.S. PATENT DOCUMENTS

| | | | | |
|---|---|---|---|---|
| 2016/0047030 A1* | 2/2016 | Obata | ............... | H10K 71/00 118/721 |
| 2016/0126507 A1* | 5/2016 | Ko | ............... | C23C 14/042 438/34 |
| 2016/0263607 A1* | 9/2016 | Wang | ............... | B23K 26/362 |
| 2019/0136365 A1* | 5/2019 | Kawasaki | ............... | C23C 16/045 |
| 2019/0378984 A1* | 12/2019 | Nakamura | ............... | C23F 1/02 |
| 2021/0141304 A1* | 5/2021 | Liu | ............... | G03F 1/38 |

FOREIGN PATENT DOCUMENTS

| | | |
|---|---|---|
| CN | 108281575 A | 7/2018 |
| CN | 207775334 U | 8/2018 |
| CN | 108611596 A | 10/2018 |
| CN | 108796435 A | 11/2018 |
| CN | 109487206 A | 3/2019 |
| CN | 208604193 U | 3/2019 |
| CN | 109778116 A | 5/2019 |
| CN | 110158028 A | 8/2019 |
| CN | 111172495 A | 5/2020 |
| WO | 2020000185 A1 | 1/2020 |

OTHER PUBLICATIONS

China Patent Office, Second Office Action issued Nov. 25, 2021 for application No. CN202010075660.1.

* cited by examiner forming a first metal layer including a mask pattern area, the mask pattern area including at least one mask unit, the first metal layer further including two preliminary opening areas and two first welding sub-layers, the two preliminary opening areas are respectively located on different sides of the mask pattern area in the first direction, wherein one first welding sub-layer is located on a side of one preliminary opening area away from the mask pattern area in the first direction, the other first welding sub-layer is located on a side of the other preliminary opening area away from the mask pattern area in the first direction, a plurality of evaporation holes are provided in the mask unit, and a thickness of the mask pattern area, a thickness of the preliminary opening area, and a thickness of the first welding sub-layer are equal ⟶ S1 forming a plurality of buffer holes in the preliminary opening area, a ratio of a maximum dimension of the buffer hole in any direction in a plane where the mask plate is located to a maximum dimension of the evaporation hole in the direction is greater than 100, the plurality of buffer holes are distributed at equal intervals in the second direction, and the second direction is located in the plane where the mask plate is located and is perpendicular to the first direction ⟶ S2 forming a photoresist layer exposing at least the first welding sub-layer ⟶ S3 growing a second welding sub-layer on the first welding sub-layer using an electroplating process to obtain the welding area ⟶ S4

Fig. 6

MASK PLATE, METHOD FOR FABRICATING THE SAME, AND MASK PLATE ASSEMBLY

CROSS-REFERENCE TO RELATED APPLICATIONS

This is a National Phase Application filed under 35 U.S.C. 371 as a national stage of PCT/CN2021/071255, filed on Jan. 12, 2021, an application claiming the priority to Chinese Patent Application No. 202010075660.1, filed on Jan. 22, 2020, which is hereby incorporated by reference in its entirety.

TECHNICAL FIELD

The present disclosure relates to the field of display technologies, and more particularly, to a mask plate, a mask plate assembly and a method for fabricating the mask plate.

BACKGROUND

In the semiconductor manufacturing process, the photolithography process is a very important step, and the photolithography process is mainly adopted to copy the pattern on a mask plate onto a silicon wafer to prepare for the subsequent etching or ion implantation process.

SUMMARY

The present disclosure provides a mask plate, a mask plate assembly and a method for fabricating the mask plate.

In a first aspect of the present disclosure, there is provided a mask plate, including a mask pattern area including at least one mask unit, wherein the mask plate further includes two opening areas and two welding areas, the two opening areas being respectively on different sides of the mask pattern area along a first direction. One welding area of the two welding areas is on a side of one opening area of the two opening areas away from the mask pattern area along the first direction, and the other welding area of the two welding areas is on a side of the other opening area of the two opening areas away from the mask pattern area along the first direction. A plurality of evaporation holes are arranged in the mask unit, a plurality of buffer holes are arranged in each of the two opening areas, a ratio of a maximum dimension of each of the buffer holes in any direction in a plane where the mask plate is located to a maximum dimension of each of the plurality of evaporation holes in the direction is greater than 100, the plurality of buffer holes are distributed at equal intervals along a second direction, and the second direction is in the plane where the mask plate is located and is perpendicular to the first direction.

In some embodiments, in the second direction, a farthest distance between a center line of the mask plate extending in the first direction and boundaries of the plurality of buffer holes is a first distance, a farthest distance between the center line of the mask plate extending in the first direction and boundaries of the plurality of evaporation holes is a second distance, and an absolute value of a difference between the first distance and the second distance is less than or equal to about 2 mm.

In some embodiments, the plurality of buffer holes are arranged in a plurality of rows along the second direction and in a plurality of columns along the first direction, and the plurality of buffer holes are further equally spaced along the first direction.

In some embodiments, the plurality of buffer holes are arranged in an array along the first and second directions.

In some embodiments, a maximum dimension of each of the plurality of buffer holes in the first direction is between about 5 mm and about 20 mm In some embodiments, a maximum dimension of each of the plurality of buffer holes in the second direction is between about 1.5 mm and about 4 mm.

In some embodiments, a spacing in the first direction between adjacent buffer holes of the plurality of buffer holes in the first direction is between about 0.5 mm and about 2 mm.

In some embodiments, a spacing in the second direction between adjacent buffer holes of the plurality of buffer holes in the second direction is between about 0.5 mm and about 2 mm.

In some embodiments, among the two welding areas and the two opening areas, a transition area is provided between the welding area and the opening area adjacent to each other, and in the first direction, a minimum spacing between the plurality of buffer holes and the transition area is between about 0.5 mm and about 2 mm.

In some embodiments, a minimum spacing between the plurality of buffer holes and the plurality of evaporation holes is between about 3 mm and about 5 mm.

In some embodiments, the plurality of buffer holes are rectangles having a same size, and a long side direction of the rectangles is the first direction; alternatively, the plurality of buffer holes are squares having a same size, and a side of each of the squares is oriented in the first direction; alternatively, the plurality of buffer holes are circles having a same size.

In some embodiments, a thickness of the mask pattern area is the same as a thickness of the opening area.

In some embodiments, a thickness of the mask pattern area is between about 4 μm and about 30 μm.

In some embodiments, a thickness of each of the two welding areas is between about 15 μm and about 30 μm.

In some embodiments, a material of the mask plate is a nickel-iron alloy containing at least one trace element of silicon, manganese, titanium, oxygen, carbon, oxygen, or phosphorus.

In some embodiments, among the two welding areas and the two opening areas, a thickness of the welding area is larger than a thickness of the opening area, and a transition area is further provided between the welding area and the opening area adjacent to each other, a thickness of the transition area gradually decreases along a direction from the welding area adjacent to the transition area to the opening area adjacent to the transition area, and the thickness of the transition area is between the thickness of the welding area and the thickness of the opening area.

In some embodiments, among the two welding areas and the two opening areas, a thickness of the welding area is larger than a thickness of the opening area, and a transition area is further provided between the welding area and the opening area adjacent to each other, and in the first direction, a thickness of the mask plate gradually decreases from a boundary of the transition area with the welding area adjacent to the transition area to a set position of the opening area adjacent to the transition area, and the set position is aligned with an inner position of the buffer hole.

In a second aspect of the present disclosure, there is provided a mask plate assembly, including a frame and a mask plate, where the mask plate is the mask plate according to the first aspect, and a dimension of the mask plate in the first direction is larger than a dimension of the mask plate in the second direction, the frame is of a rectangular shape, one welding area of the mask plate is welded onto a first side of the frame, and the other welding area of the mask plate is welded onto a side of the frame opposite to the first side.

In a third aspect of the present disclosure, there is provided a method for fabricating a mask plate, including: forming a first metal layer including a mask pattern area, the mask pattern area including at least one mask unit, the first metal layer further including two preliminary opening areas and two first welding sub-layers, the two preliminary opening areas being respectively on different sides of the mask pattern area in a first direction, wherein one first welding sub-layer of the two first welding sub-layers is on a side of one preliminary opening area of the two preliminary opening areas away from the mask pattern area in the first direction, the other first welding sub-layer of the two first welding sub-layers is on a side of the other preliminary opening area of the two preliminary opening areas away from the mask pattern area in the first direction, a plurality of evaporation holes are provided in the mask unit, and a thickness of the mask pattern area, a thickness of the preliminary opening area, and a thickness of the first welding sub-layer are equal; and forming a plurality of buffer holes in each of the two preliminary opening areas, a ratio of a maximum dimension of each of the plurality of buffer holes in any direction in a plane where the mask plate is located to a maximum dimension of each of the plurality of evaporation holes in the direction is greater than 100, the plurality of buffer holes being distributed at equal intervals in the second direction, and the second direction being located in the plane where the mask plate is located and being perpendicular to the first direction.

In some embodiments, the plurality of buffer holes are formed by a laser cutting process.

In some embodiments, the first metal layer is formed by an electroplating process.

BRIEF DESCRIPTION OF THE DRAWINGS

FIG. 6 is a flowchart illustrating a method for fabricating a mask plate according to an embodiment of the present disclosure.

DETAILED DESCRIPTION

In order that those skilled in the art will better understand the technical solutions of the present disclosure, the following detailed description is given with reference to the accompanying drawings and the specific embodiments.

With the development of optical and semiconductor technologies, flat panel displays represented by Liquid Crystal Displays (LCDs) and Organic Light Emitting Diode (OLED) displays have the characteristics of lightness, thinness, low energy consumption, fast response speed, good color purity, high contrast, and the like, and occupy a leading position in the display field. In the semiconductor manufacturing process, the photolithography process is a very important step, and the photolithography process is mainly adopted to copy the pattern on the mask plate onto the silicon wafer to prepare for the subsequent etching or ion implantation process.

In a mask fabricating process, for example, in a Fine Metal Mask (FMM) mode involved in the related art, an Organic Light Emitting Diode (OLED) material is deposited on a Low Temperature Polysilicon (LTPS) back plate by evaporation according to a predetermined procedure, that is, an organic light emitting material such as R/G/B material is deposited on a predetermined position by using a pattern on the FMM. However, the fine metal mask plate (FMM plate) may have wrinkles on the surface thereof after being stretched, which may affect the flat state of the evaporation effective area, and further affect the quality of the product subjected to the evaporation.

Accordingly, the present disclosure provides, inter alia, a mask plate, a mask plate assembly, and a method for fabricating the mask plate that substantially obviate one or more of the problems due to limitations and disadvantages of the existing art.

Figure 1:
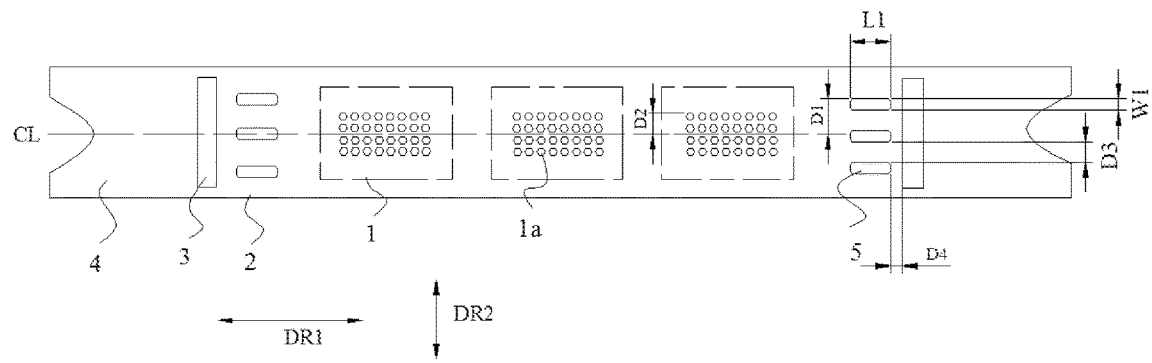
FIG. 1 is a front view of a mask plate according to an embodiment of the present disclosure.

An embodiment of the present disclosure provides a mask plate, and referring to FIG. 1 to 4, the mask plate includes a mask pattern area including at least one mask unit 1. The mask plate further includes two opening areas 2 and two welding areas 4, the two opening areas 2 being respectively located on different sides of the mask pattern area along a first direction DR1, wherein one welding area 4 is located on a side of one opening area 2 away from the mask pattern area along the first direction DR1, and the other welding area 4 is located on a side of the other opening area 2 away from the mask pattern area along the first direction DR1. A plurality of evaporation holes 1a are arranged in the mask unit 1, a plurality of buffer holes 5 are arranged in the opening area 2, a ratio of a maximum dimension of the buffer hole 5 in any direction in a plane where the mask plate is located to a maximum dimension of the evaporation hole 1a in the direction is greater than 100, the plurality of buffer holes 5 are distributed at equal intervals along a second direction DR2, and the second direction DR2 is on the plane where the mask plate is located and is perpendicular to the first direction DR1. In some embodiments, and as shown in FIG. 1, the first direction DR1 is a length direction of the mask plate, and the second direction DR2 is a width direction of the mask plate.

In the process of fabricating an OLED display substrate, the organic light emitting material is deposited on a corresponding region of the OLED display substrate through the evaporation holes 1a. One evaporation hole 1a corresponds to and is used for forming one sub-pixel. A size of the evaporation hole 1a is generally in a numerical range of about 10 μm to about 50 μm.

One mask unit 1 corresponds to one organic light emitting diode display substrate. The region in which the evaporation holes 1a in one mask unit 1 are located corresponds to the region in which all the pixel regions of one OLED display substrate are located. The mask plate shown in FIG. 1 may be used for processing three OLED display substrates in a mother substrate of the display substrate at a time, or may be used for processing three independent OLED display substrates at a time. The mask units 1 in the mask plate are not limited to only one row, and for example, a plurality of mask units 1 arranged in an array having 2 rows and 2 columns may be used.

In the embodiment of the present disclosure, the opening area 2 is provided between the mask pattern area and the welding area 4. The opening area 2 is provided therein with buffer holes 5. The buffer hole 5 is a through hole having an overall size two orders of magnitude larger than that of the evaporation hole 1a in the mask pattern area. Moreover, the buffer holes 5 are regularly distributed. In this way, in two directions from the middle of the mask plate along the first direction DR1, the densely distributed evaporation holes 1a with small size, the uniformly distributed buffer holes 5 with large size, and the welding areas 4 without via hole structures are arranged in sequence. The buffer holes 5 have a transition effect in structure, so that a transition region exists between the mask pattern area and the welding area 4 for the stress distribution, and the defects of wrinkles of the mask plate when being stretched can be alleviated.

It should be noted that, in the mask unit 1, other structures than the evaporation holes 1a may be provided. For example, in some embodiments, structures (not shown) for welding may also be provided at four corners of the mask unit 1.

Figure 5:
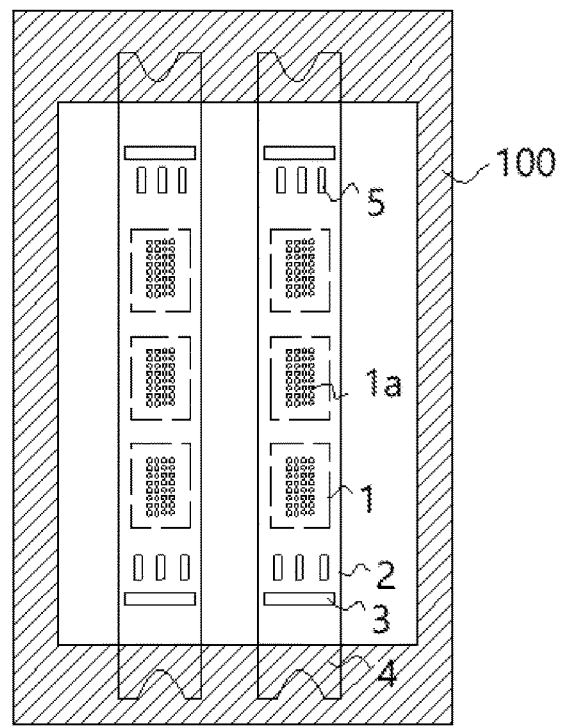
FIG. 5 is a front view of a mask plate assembly according to an embodiment of the present disclosure.

Referring to FIG. 5, the mask plate is in a usage state, and the two welding areas 4 are fixed to a frame 100. The boundary of the mask plate extending in the first direction DR1 is not limited to be a straight line, and in other embodiments, for example, a portion may be protruded outward from the boundary of the mask plate extending in the first direction DR1, and the protruded portion may be fixed to the frame 100.

In some embodiments, and referring to FIG. 1, a farthest distance from a center line CL of the mask plate extending in the first direction DR1 to boundaries of the plurality of buffer holes 5 is a first distance D1, a farthest distance from the center line CL of the mask plate extending in the first direction DR1 to boundaries of the plurality of evaporation holes 1a is a second distance D2, and an absolute value of a difference between the first distance D1 and the second distance D2 is less than or equal to 2 mm.

The purpose of this arrangement is to make the outermost boundary of all the buffer holes 5 as a whole and the outermost boundary of all the evaporation holes 1a as a whole closer to the same level, so that the outside environments of the two are more consistent, and uniform change of stress is facilitated.

Figure 2:
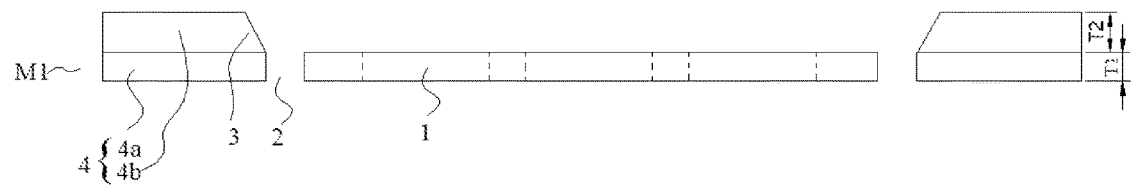
FIG. 2 is a diagram showing a stacking relationship of the mask plate shown in FIG. 1.

In some embodiments, and referring to FIG. 2, a thickness (T1+T2) of the welding area 4 is greater than a thickness T1 of the opening area 2, and a transition area 3 is further disposed between the welding area 4 and the opening area 2 adjacent to each other, a thickness of the transition area 3 gradually decreases in a direction from the welding area 4 to the opening area 2, and the thickness of the transition area 3 is between the thickness of the welding area 4 and the thickness of the opening area 2.

The purpose of the larger thickness of the welding area 4 is to facilitate the operations during the welding and fixing process. The gradual change of the thickness of the transition area 3 is to relieve the abrupt change of the stress between the welding area 4 and the opening area 2 (and the mask pattern area) caused by the thickness of the welding area 4.

Figure 8:
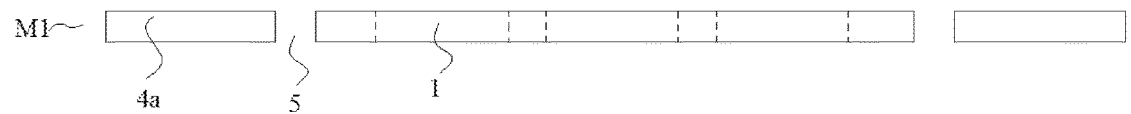
FIG. 8 is a schematic structural view of a mask plate at an intermediate stage of fabrication according to an embodiment of the present disclosure.

Of course, the mask plate may also have a uniform thickness. FIG. 8 shows a product form at an intermediate stage when the mask plate shown in FIG. 2 is fabricated, and the mask plate shown in FIG. 8 may also be used as a finished product in some embodiments.

Of course, the transition area 3 in FIGS. 1 and 2 may be omitted, if the difference between the thickness of the welding area 4 and the thickness of the opening area 2 is small.

Figure 10:
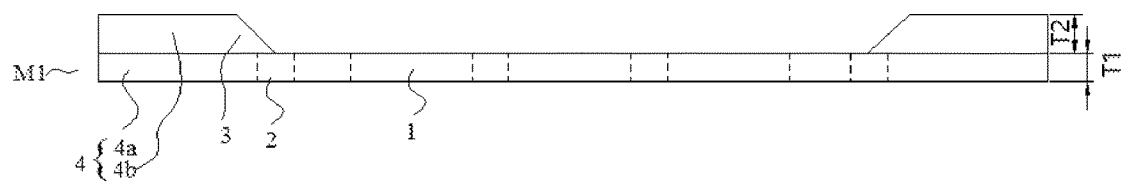
FIG. 10 is a diagram showing a stacking relationship of a mask plate according to another embodiment of the present disclosure.

In other embodiments, and referring to FIG. 10, the area with gradually changed thickness extends into the opening area 2. That is, the thickness of the mask plate at an outer side of the buffer holes 5 is gradually varied in a portion and uniform in another portion. The thickness of the welding area 4 is larger than that of the opening area 2, a transition area 3 is further provided between the welding area 4 and the opening area 2 adjacent to each other, the thickness of the mask plate is gradually decreased from the boundary of the transition area 3 with the adjacent welding area 4 to a set position of the adjacent opening area 2 of the transition area 3 in the first direction DR1, and the set position is aligned with an inner position of the buffer hole 5 in the second direction DR 2.

Of course, the thickness of the mask pattern area and the thickness of the opening area 2 may be uniform and equal.

Figure 7:
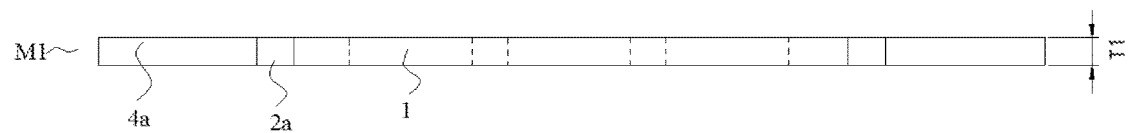
FIG. 7 is a schematic structural view of a mask plate at an intermediate stage of fabrication according to an embodiment of the present disclosure.

It should be noted that, since the difference in size between the evaporation hole 1a and the buffer hole 5 is too large, the evaporation hole 1a is not shown in FIGS. 2, 7, and 8.

Figure 3:
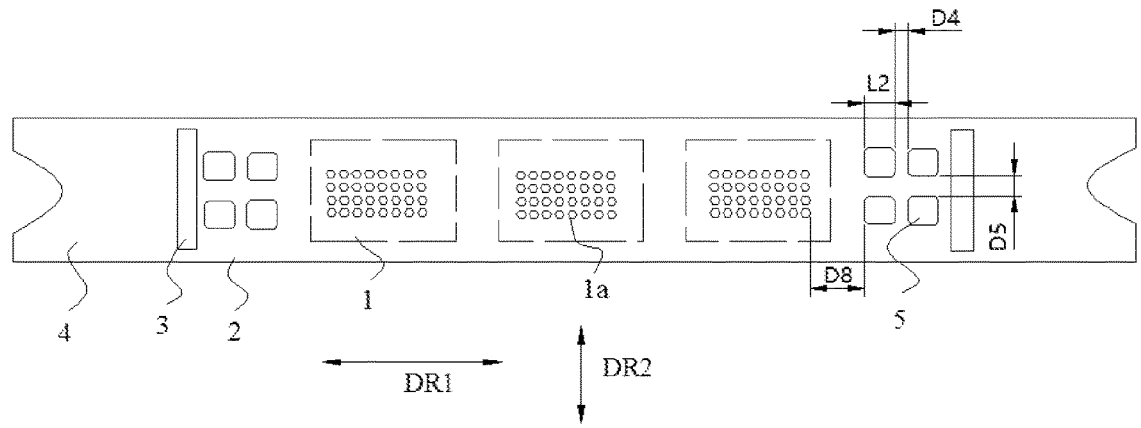
FIG. 3 is a front view of a mask plate according to another embodiment of the present disclosure.
Figure 4:
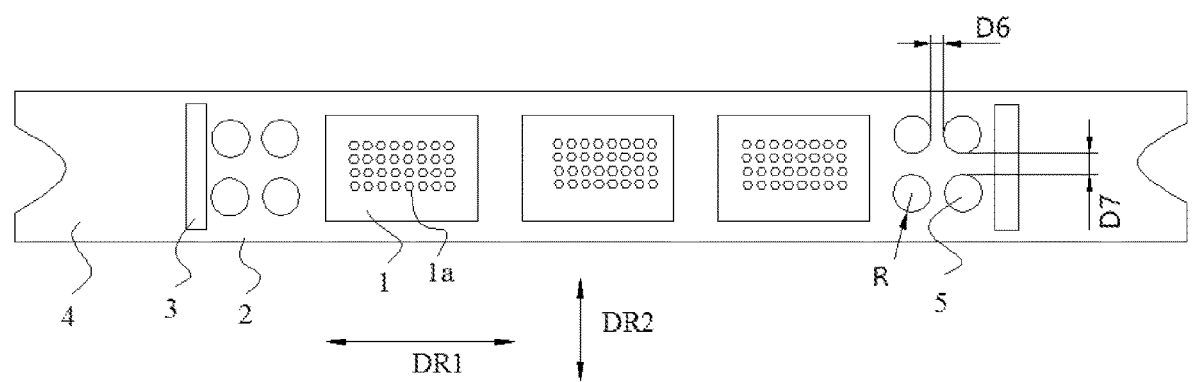
FIG. 4 is a front view of a mask plate according to another embodiment of the present disclosure.

In some embodiments, and referring to FIGS. 3 and 4, the plurality of buffer holes 5 are arranged in a plurality of rows along the second direction DR2 and in a plurality of columns along the first direction DR1, and the plurality of buffer holes 5 are also equally spaced along the first direction DR1. Whereas in FIG. 1, the plurality of buffer holes 5 are arranged in one row in the second direction DR2.

The evaporation holes 1a are usually arranged in an array, and the buffer holes 5 are arranged in the same manner, which is more favorable for smooth transition of stress from the mask pattern area to the welding area 4.

In some embodiments, the maximum dimension of the buffer hole 5 in the first direction DR1 is between about 5 mm and about 20 mm.

In some embodiments, the maximum dimension of the buffer hole 5 in the second direction DR2 is between about 1.5 mm and about 5 mm.

The size of the buffer hole 5 is on the one hand sufficiently larger than the size of the conventional pixel hole, and on the other hand, in most cases the first direction DR1 of the mask plate is the extending direction of the long side thereof and the second direction DR2 is the extending direction of the short side thereof, so that in terms of specific values, the maximum dimension of a single buffer hole 5 in the first direction DR1 tends to be larger than its maximum dimension in the second direction DR2.

In some embodiments, a spacing in the first direction DR1 between adjacent buffer holes 5 in the first direction DR1 is between about 0.5 mm and about 2 mm.

In some embodiments, a spacing in the second direction DR2 between adjacent buffer holes 5 in the second direction DR2 is between about 0.5 mm and about 2 mm.

In this way, the spacing between the buffer holes 5 is sufficiently larger than the spacing between the evaporation holes 1a, and the smooth transition of stress when the mask plate is stretched is facilitated.

In some embodiments, a minimum spacing between the buffer holes 5 and the transition area 3 is between about 0.5 mm and about 2 mm.

For example, in FIG. 1, the distance D4 between the rectangular buffer holes 5 and the transition area 3 is approximately 1 mm.

In this way, there is a buffer distance between the thicker structure of the welding area 4 and the larger buffer holes 5.

In some embodiments, a minimum spacing between the buffer holes 5 and the evaporation holes 1a is between about 3 mm and about 5 mm.

For example, in FIG. 3, the distance D8 between the square buffer hole 5 and the nearest evaporation hole 1a is about 4 mm.

In this way, there is a buffer distance between the larger buffer holes 5 and the smaller evaporation holes 1a.

In an example, and referring to FIG. 1, the plurality of buffer holes 5 are rectangles having the same size, and the long side direction of the rectangles is the first direction DR1.

In an embodiment, the rectangles have a length L1 of about 10 mm, a width W1 of about 2 mm, are chamfered at the vertices by about 45°, and are arranged in one row along the second direction DR2 with a spacing D3 of about 2 mm between adjacent rectangles.

Referring to FIG. 3, the plurality of buffer holes 5 are squares with the same size, and one side of the square is oriented in the first direction DR1. The corners of the square may be chamfered, for example, by about 45°, to make the boundaries of the buffer holes 5 smoother.

In an embodiment, the length of the side L2 of the square is about 5 mm, the spacing D4 between adjacent squares in the first direction DR1 is about 1 mm, and the spacing D5 between adjacent squares in the second direction DR2 is about 2 mm.

Referring to FIG. 4, the plurality of buffer holes 5 are circles with the same size.

In an embodiment, a radius R of the circle is about 5 mm, the spacing D6 between adjacent circles in the first direction DR1 is about 1 mm, and the spacing D7 between adjacent circles in the second direction DR2 is about 2 mm.

In some embodiments, a thickness of the mask pattern area is between about 4 μm to about 30 μm. This is the conventional thickness of a fine metal mask plate. This thickness is close to the size of the evaporation hole 1a.

In some embodiments, the thickness of the welding area 4 is between about 15 μm to about 30 μm. The thickness of the welding area 4 may be equal to, or slightly thicker than, that of the mask pattern area.

In some embodiments, the material of the mask plate is a nickel-iron alloy containing at least one trace element of silicon, manganese, titanium, oxygen, carbon, oxygen, or phosphorus. This type of mask plate may be formed by an electroplating process, i.e., by adding corresponding ions to the plating solution. Of course, the material of the mask plate is not limited thereto.

Referring to FIG. 5, an embodiment of the present disclosure further provides a mask plate assembly, which includes a frame 100 and a mask plate, where the mask plate is the aforementioned mask plate, and the welding areas 4 are fixed onto the frame 100.

A dimension of the mask plate in the first direction DR1 is larger than a dimension thereof in the second direction DR2, the frame 100 is rectangular, one welding area 4 of the mask plate is welded to a first side of the frame 100, and the other welding area 4 of the mask plate is welded to an opposite side of the first side.

Due to the existence of the buffer holes 5, the change of stress from the welding area 4 to the mask pattern area is smoother when the mask plate is stretched, thereby alleviating wrinkle defects.

An embodiment of the present disclosure further provides a method for fabricating a mask plate, which is used for fabricating the above mask plate. Some of the technical details may be referred to the above description. Referring to FIG. 6, the method includes the following steps S1 to S4.

At step S1, referring to FIG. 7, a first metal layer M1 is formed, the first metal layer M1 includes a mask pattern area, the mask pattern area includes at least one mask unit 1, the first metal layer M1 further includes two preliminary opening areas 2a and two first welding sub-layers 4a, the two preliminary opening areas 2a are respectively located on different sides of the mask pattern area in the first direction DR1, wherein one first welding sub-layer 4a is located on a side of one preliminary opening area 2a away from the mask pattern area in the first direction DR1, the other first welding sub-layer 4a is located on a side of the other preliminary opening area 2a away from the mask pattern area in the first direction DR1, a plurality of evaporation holes 1a are provided in the mask unit 1, and a thickness of the mask pattern area, a thickness of the preliminary opening area 2a, and a thickness of the first welding sub-layer 4a are equal.

The outer contour of the first metal layer M1 may be formed by an electroplating process, and the evaporation holes 1a may be formed by a photolithography process. The photolithography process includes one or more steps of forming a material layer, coating photoresist, exposing, developing, etching, stripping photoresist, and the like.

When the electroplating process is performed, a seed layer may be first subjected to a photolithography process to form a void corresponding to the evaporation hole 1a in the seed layer, and then the first metal layer M1 may be formed by an electroplating process.

At step S2, referring to FIG. 8, a plurality of buffer holes 5 are formed in the preliminary opening area 2a, a ratio of a maximum dimension of the buffer hole 5 in any direction in a plane where the mask plate is located to a maximum dimension of the evaporation hole 1a in the direction is greater than 100, the plurality of buffer holes 5 are distributed at equal intervals in the first direction DR1 and distributed at equal intervals in the second direction DR2, and the second direction DR2 is located in the plane where the mask plate is located and is perpendicular to the first direction DR1.

In some embodiments, the fabrication of the mask plate is completed when the step S2 is completed.

At step S3, a photoresist layer 10 is formed, the photoresist layer 10 exposing at least the first welding sub-layer 4a.

Figure 9:
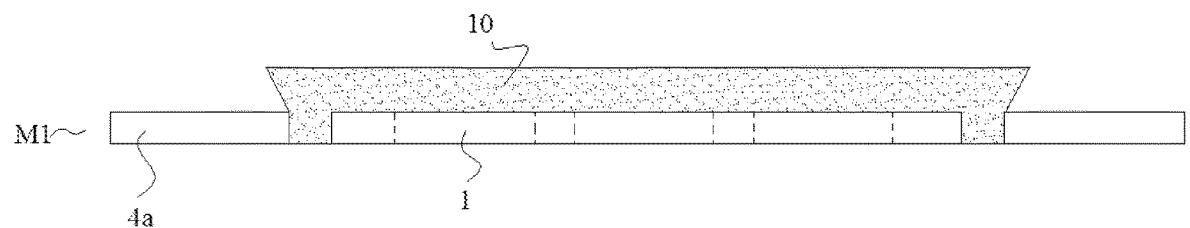
FIG. 9 is a schematic structural view of a mask plate at an intermediate stage of fabrication according to an embodiment of the present disclosure.

In an example, boundaries of both ends of the photoresist layer along the first direction DR1 may be substantially perpendicular to the first metal layer M1. Of course, as shown in FIG. 9, the boundaries of both ends of the photoresist layer along the first direction DR1 may be inclined inward from top to bottom. Such a type of boundary of the photoresist layer may be formed by placing a mold at this position while the photoresist is applied, and removing the mold after the photoresist is cured.

At step S4, a second welding sub-layer 4b is grown on the first welding sub-layer 4a using an electroplating process to obtain the welding area 4. In this way, the welding area 4 may be thickened, or the shape of the boundary of the welding area 4 may be modified. That is, the transition area 3 may also be obtained simultaneously in this step.

In some embodiments, the buffer holes 5 are formed by a laser cutting process. Of course, the buffer holes 5 may be formed by a photolithography process. However, the buffer holes 5 are preferably formed by a laser cutting process because the size of the buffer holes 5 is large and the cost of the mask plate used in the photolithography process is high.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. A mask plate, comprising a mask pattern area comprising at least one mask unit, wherein the mask plate further comprises two opening areas and two welding areas, the two opening areas being respectively on different sides of the mask pattern area along a first direction, wherein
a first welding area of the two welding areas is on a side of a first opening area of the two opening areas away from the mask pattern area along the first direction, and the other welding area of the two welding areas is on a side of the other opening area of the two opening areas away from the mask pattern area along the first direction;
a plurality of evaporation holes are arranged in the at least one mask unit, a plurality of buffer holes are arranged in each of the two opening areas, a ratio of a maximum dimension of each of the buffer holes in any direction in a plane where the mask plate is located to a maximum dimension of each of the plurality of evaporation holes in the direction is greater than 100, the plurality of buffer holes are distributed at equal intervals along a second direction, and the second direction is in the plane where the mask plate is located and is perpendicular to the first direction,
wherein in the second direction, a farthest distance between a center line of the mask plate extending in the first direction and boundaries of the plurality of buffer holes is a first distance, a farthest distance between the center line of the mask plate extending in the first direction and boundaries of the plurality of evaporation holes is a second distance, and an absolute value of a difference between the first distance and the second distance is less than or equal to about 2 mm.

2. The mask plate of claim 1, wherein the plurality of buffer holes are arranged in a plurality of rows along the second direction and in a plurality of columns along the first direction, and the plurality of buffer holes are further equally spaced along the first direction.

3. The mask plate of claim 2, wherein a maximum dimension of each of the plurality of buffer holes in the first direction is about 20 mm.

4. The mask plate of claim 2, wherein a maximum dimension of each of the plurality of buffer holes in the second direction is about 5 mm.

5. The mask plate of claim 2, wherein a spacing in the first direction between adjacent buffer holes of the plurality of buffer holes in the first direction is between about 0.5 mm and about 2 mm; and a spacing in the second direction between adjacent buffer holes of the plurality of buffer holes in the second direction is between about 0.5 mm and about 2 mm.

6. The mask plate of claim 2, wherein among the two welding areas and the two opening areas, a transition area is provided between the first welding area and the first opening area adjacent to each other,
in the first direction, a minimum spacing between the plurality of buffer holes and the transition area is about 0.5 mm, and a minimum spacing between the plurality of buffer holes and the plurality of evaporation holes is about 3 mm.

7. The mask plate of claim 2, wherein the plurality of buffer holes are rectangles having a same size, and a long side direction of the rectangles is the first direction.

8. The mask plate of claim 2, wherein the plurality of buffer holes are squares having a same size, and a side of each of the squares is oriented in the first direction.

9. The mask plate of claim 2, wherein the plurality of buffer holes are circles having a same size.

10. The mask plate of claim 1, wherein a thickness of the mask pattern area is the same as a thickness of the first opening area.

11. The mask plate of claim 1, wherein a thickness of the mask pattern area is between about 4 μm and about 30 μm.

12. The mask plate of claim 1, wherein a thickness of each of the two welding areas is between about 15 μm and about 30 μm.

13. The mask plate of claim 1, wherein a material of the mask plate is a nickel-iron alloy containing at least one trace element of silicon, manganese, titanium, oxygen, carbon, and phosphorus.

14. The mask plate of claim 1, wherein among the two welding areas and the two opening areas, a thickness of the first welding area is larger than a thickness of the first opening area, and a transition area is further provided between the first welding area and the first opening area adjacent to each other,
a thickness of the transition area decreases along a direction from the first welding area adjacent to the transition area to the first opening area adjacent to the transition area, and the thickness of the transition area is between the thickness of the first welding area and the thickness of the first opening area.

15. The mask plate of claim 1, wherein among the two welding areas and the two opening areas, a thickness of the first welding area is larger than a thickness of the first opening area, and a transition area is further provided between the first welding area and the first opening area adjacent to each other,
in the first direction, a thickness of the mask plate decreases from a boundary of the transition area with the first welding area adjacent to the transition area to a set position of the first opening area adjacent to the transition area, and the set position is aligned with an inner position of a buffer hole.

16. A mask plate assembly, comprising a frame and a mask plate, wherein the mask plate is the mask plate of claim 1, and a dimension of the mask plate in the first direction is larger than a dimension of the mask plate in the second direction, the frame is of a rectangular shape, the first welding area of the mask plate is welded onto a first side of the frame, and the other welding area of the mask plate is welded onto a side of the frame opposite to the first side.

17. A method for fabricating a mask plate, comprising: forming a first metal layer comprising a mask pattern area, the mask pattern area comprising at least one mask unit, the first metal layer further comprising two preliminary opening areas and two welding sub-layers, the two preliminary opening areas being respectively on different sides of the mask pattern area in a first direction, wherein a first welding sub-layer of the two welding sub-layers is on a side of a first preliminary opening area of the two preliminary opening areas away from the mask pattern area in the first direction, the other welding sub-layer of the two welding sub-layers is on a side of the other preliminary opening area of the two preliminary opening areas away from the mask pattern area in the first direction, a plurality of evaporation holes are provided in the at least one mask unit, and a thickness of the mask pattern area, a thickness of the first preliminary opening area, and a thickness of the first welding sub-layer are equal; and forming a plurality of buffer holes in each of the two preliminary opening areas, a ratio of a maximum dimension of each of the plurality of buffer holes in any direction in a plane where the mask plate is located to a maximum dimension of each of the plurality of evaporation holes in the direction is greater than 100, the plurality of buffer holes being distributed at equal intervals in a second direction, and the second direction being located in the plane where the mask plate is located and being perpendicular to the first direction, wherein in the second direction, a farthest distance between a center line of the mask plate extending in the first direction and boundaries of the plurality of buffer holes is a first distance, a farthest distance between the center line of the mask plate extending in the first direction and boundaries of the plurality of evaporation holes is a second distance, and an absolute value of a difference between the first distance and the second distance is less than or equal to about 2 mm.

18. The method of claim 17, wherein the plurality of buffer holes are formed by a laser cutting process.

19. The method of claim 17, wherein the first metal layer is formed by an electroplating process.

* * * * *